(12) United States Patent
Hu (10) Patent No.: US 9,125,320 B2
(45) Date of Patent: Sep. 1, 2015

(54) METHOD OF MANUFACTURING PASSIVE COMPONENT MODULE

(76) Inventor: Dyi-Chung Hu, Chutung (TW)

( * ) Notice: Subject to any disclaimer, the term of this patent is extended or adjusted under 35 U.S.C. 154(b) by 137 days.

(21) Appl. No.: 13/298,205

(22) Filed: Nov. 16, 2011

(65) Prior Publication Data

US 2013/0120949 A1    May 16, 2013

(51) Int. Cl.
| | |
|---|---|
| H05K 3/30 | (2006.01) |
| H05K 3/36 | (2006.01) |
| H05K 3/20 | (2006.01) |
| B23P 19/00 | (2006.01) |
| H05K 1/18 | (2006.01) |
| H05K 3/00 | (2006.01) |
| H05K 3/28 | (2006.01) |

(52) U.S. Cl.
CPC ............... *H05K 1/185* (2013.01); *H05K 3/007* (2013.01); *H05K 3/284* (2013.01); *H05K 2201/09918* (2013.01); *H05K 2201/10636* (2013.01); *H05K 2203/025* (2013.01); *H05K 2203/1316* (2013.01); *H05K 2203/1469* (2013.01); *Y10T 29/49135* (2015.01)

(58) Field of Classification Search
USPC .................... 29/841, 830, 831, 832, 739, 740
See application file for complete search history.

(56) References Cited

U.S. PATENT DOCUMENTS

| | | | | |
|---|---|---|---|---|
| 5,268,064 | A  * | 12/1993 | Woo et al. ........................ | 216/20 |
| 6,048,430 | A  * | 4/2000 | Johnston ........................ | 156/233 |
| 6,121,553 | A  * | 9/2000 | Shinada et al. ................ | 174/259 |
| 6,317,948 | B1 * | 11/2001 | Kola et al. ..................... | 29/25.42 |
| 7,020,956 | B2 * | 4/2006 | Kuribayashi et al. ........... | 29/832 |
| 2006/0110853 | A1* | 5/2006 | Chen et al. .................... | 438/110 |
| 2009/0179347 | A1* | 7/2009 | Chen et al. ............... | 264/272.17 |

* cited by examiner

*Primary Examiner* — David Angwin
(74) *Attorney, Agent, or Firm* — Lowe Hauptman & Ham, LLP (57) ABSTRACT

A method of manufacturing a passive component module includes the steps of: bonding passive components to a carrier, wherein each of the passive components has interconnection pads; forming a dielectric molding material over the carrier, so that the passive components are embedded in the molding material; separating the molding material, which has the passive components embedded therein, from the carrier; exposing all interconnection pads of the passive components; and building electrical interconnections between the passive components to obtain the passive component module. The steps of bonding, forming, separating, exposing and building are performed in the recited order.

15 Claims, 11 Drawing Sheets

METHOD OF MANUFACTURING PASSIVE COMPONENT MODULE

FIELD OF THE INVENTION

This invention relates to manufacture of an electronic device, and more particularly relates to a method of manufacturing a passive component module.

BACKGROUND OF THE INVENTION

Passive component is widely applied in various consumer electronics incorporating a print circuit board. While consumer electronics continues in its trend of shrinkage, more and more passive components are integrated in a print circuit board.

A highly integrated print circuit board with numerous passive components is usually manufactured by embedding one or more passive components in each cavity of a substrate. However, creating each cavity in a substrate for embedding each passive component takes time, and keeping sufficient distance between neighboring cavities can hinder further shrinkage of the print circuit board. On the other hand, arranging several passive components in a single cavity easily results in shift of components that may cause interconnection opens. Furthermore, passive components with different dimensions also increase difficulty and complexity in embedding process thereof.

Accordingly, a method capable of solving the aforementioned drawbacks is desirable.

SUMMARY OF THE INVENTION

In view of the aforementioned drawbacks in prior art, one embodiment of the invention provides a method of manufacturing a passive component module. The method comprises the steps of: providing a carrier with alignment marks; bonding passive components to the carrier based on the alignment marks, wherein each passive component has interconnection pads; forming a molding material over the carrier for molding the passive components; separating the molding material with the passive components from the carrier; exposing all interconnection pads of each passive component; and building electrical interconnections between the passive components so that the passive component module is obtained.

In another embodiment of the invention, a method of manufacturing a print circuit board is disclosed. The method comprises the steps of embedding the passive component module formed in accordance with the method of claim 1 into a substrate; embedding at least an active component into the substrate; and building electrical interconnections between the passive component module and the active component so that the print circuit board is obtained.

DETAILED DESCRIPTION OF THE INVENTION

The present invention may best be understood by reference to the following description in conjunction with the accompanying drawings, in which similar reference numbers represent similar elements. Any devices, components, materials, and steps described in the embodiments are only for illustration and not intended to limit the scope of the present invention.

FIG. 1 to FIG. 5 illustrate a method of manufacturing a passive component module.

Figure 1:
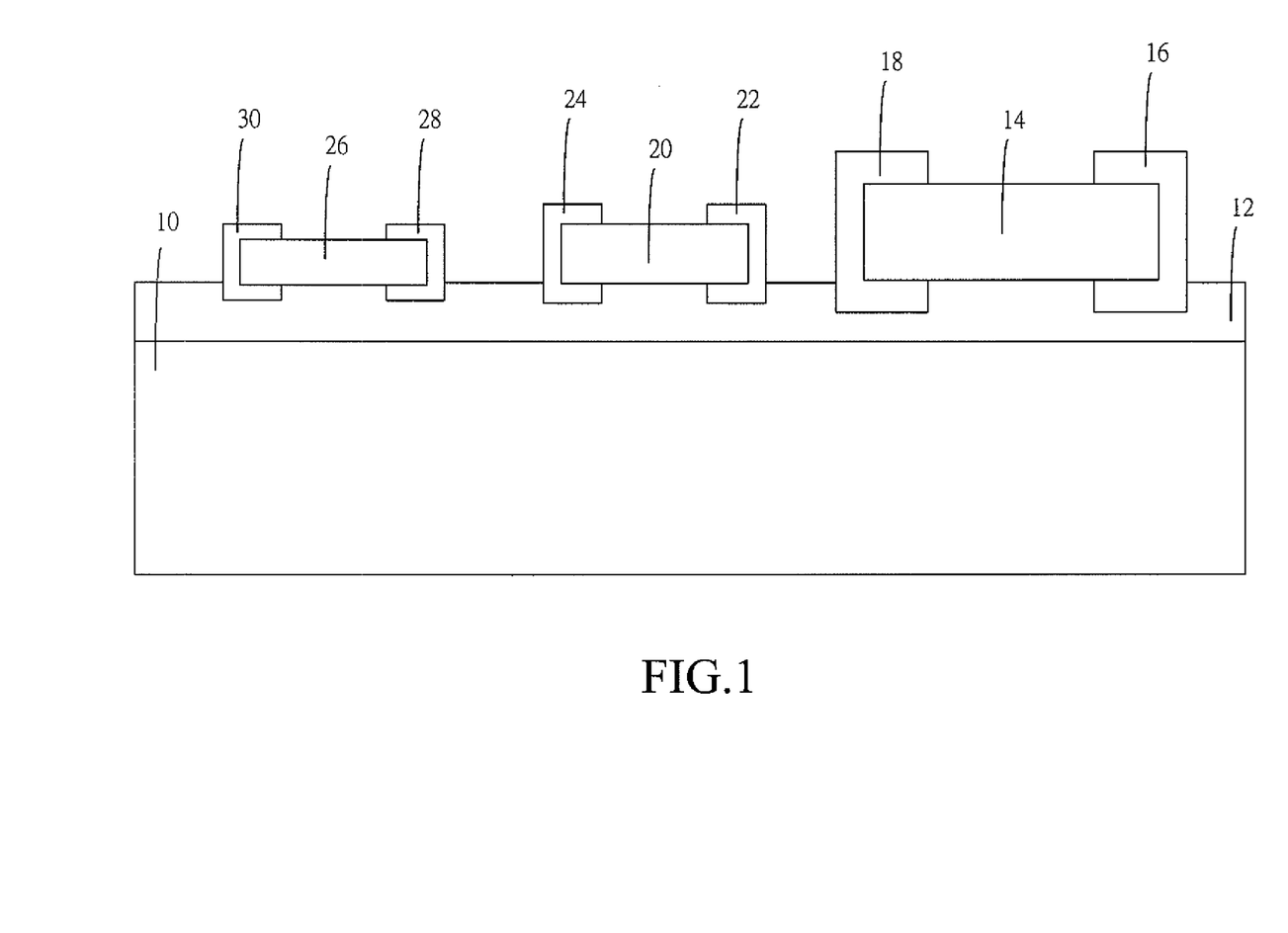
FIG. 1 to FIG. 5 illustrate a method of manufacturing a passive component module.

Referring to FIG. 1, a carrier 10 with alignment marks (not shown) thereon is provided and an adhesive layer 12 is formed overlying the carrier 10. Thereafter, a number of passive components 14, 20 and 26 are bonded to the carrier 10 using a die bonder or chip shooter. The alignment marks facilitate the bonding process by increasing precision. The adhesive layer 12 serves as a sacrificial layer for temporarily attaching the passive components 14, 20 and 26 to the carrier 10. Noted that the passive components 14, 20 and 26 respectively have interconnection pads at two ends thereof. For example, the passive component 14 has interconnection pads 16 and 18; the passive component 20 has interconnection pads 22 and 24; and the passive component 26 has interconnection pads 28 and 30. Also noted that the passive components 14, 20 and 26 have different dimensions and result in step heights therebetween accordingly. The carrier 10 may be composed of glass, fiber resin or ceramic.

Figure 2:
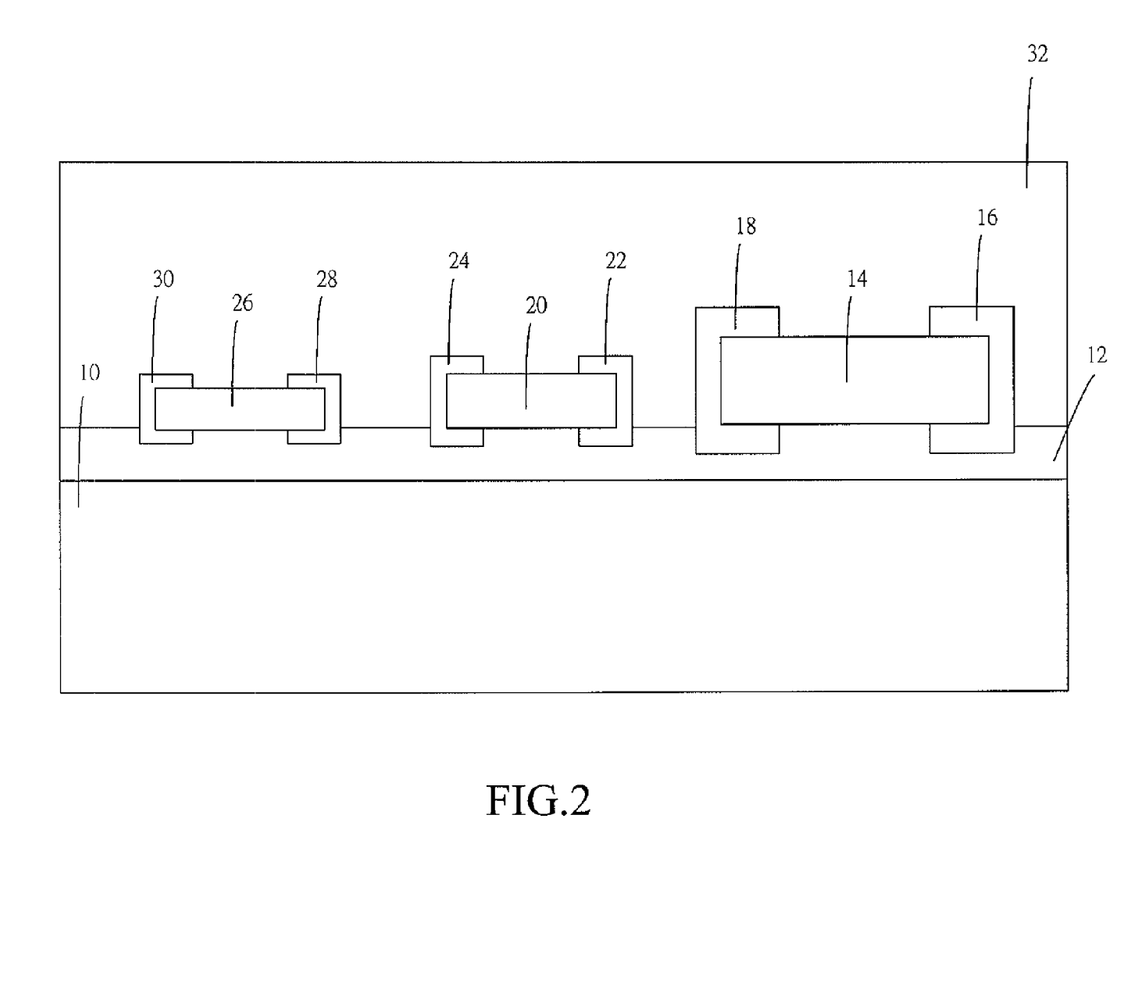

Referring to FIG. 2, a molding material 32 is formed subsequently over the adhesive layer 12 for molding the passive components 14, 20 and 26. The molding material 32 can be suitable material such as epoxy resin, and further undergoes well-known treatments after formation. In another embodiment, the molding material 32 may be directly formed over the carrier 10 for molding the passive components 14, 20 and 26 because the adhesive layer 12 is optional.

Figure 3:
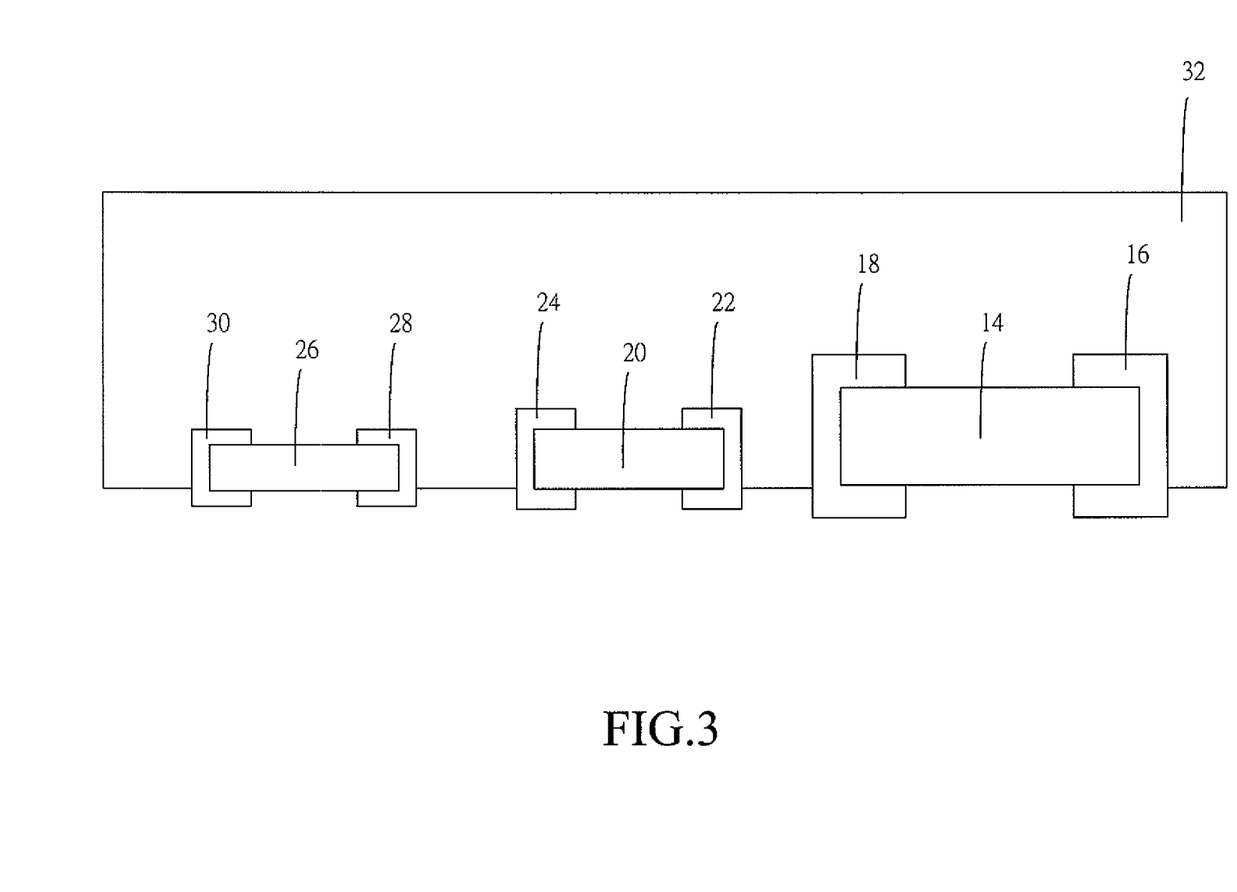

Referring to FIG. 3, the next step is performed by separating the molding material 32 with the passive components 14, 20 and 26 from the carrier 10. In this embodiment, removal of the entire adhesive layer 12 is further performed using well-known techniques.

Figure 4:
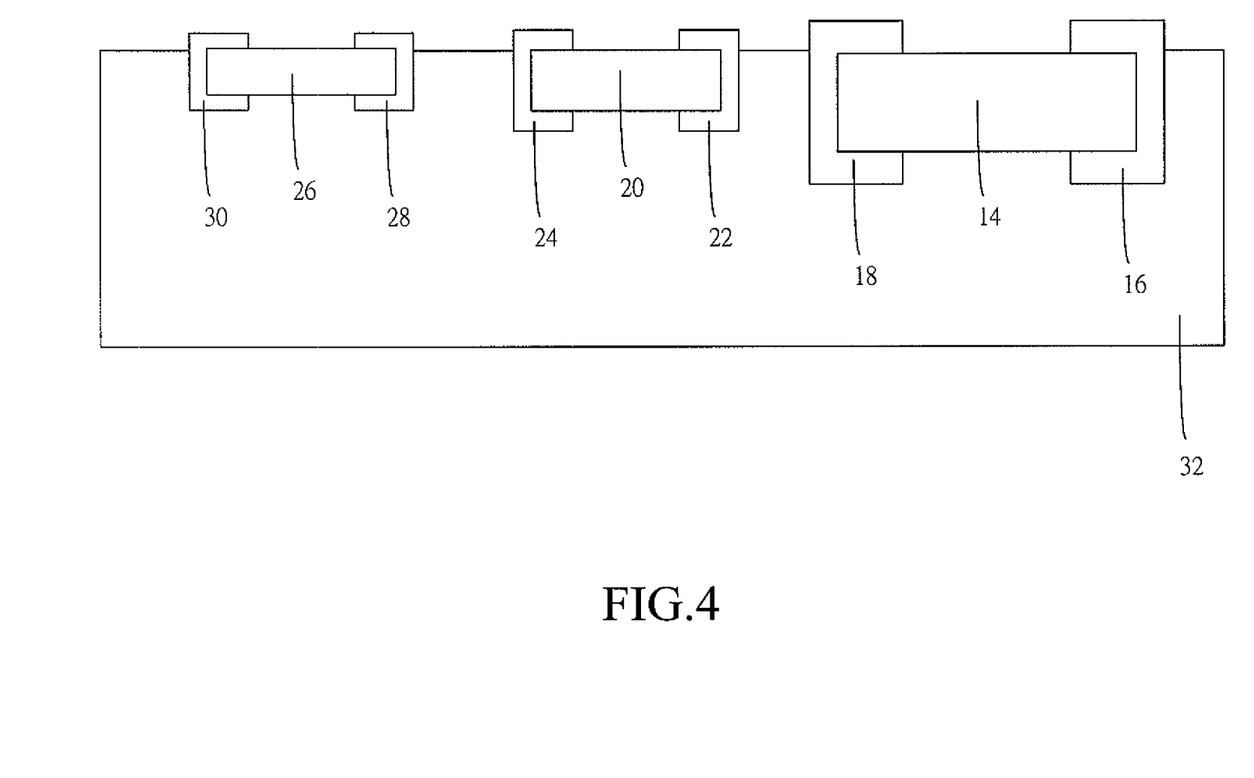

Referring to FIG. 4, the molding material 32 with the passive components 14, 20 and 26 is reversed upward for undergoing a subsequent polishing or grinding process. In another embodiment, the molding material 32 with the passive components 14, 20 and 26 may undergo a subsequent polishing or grinding process without the step of reversing.

Figure 5:
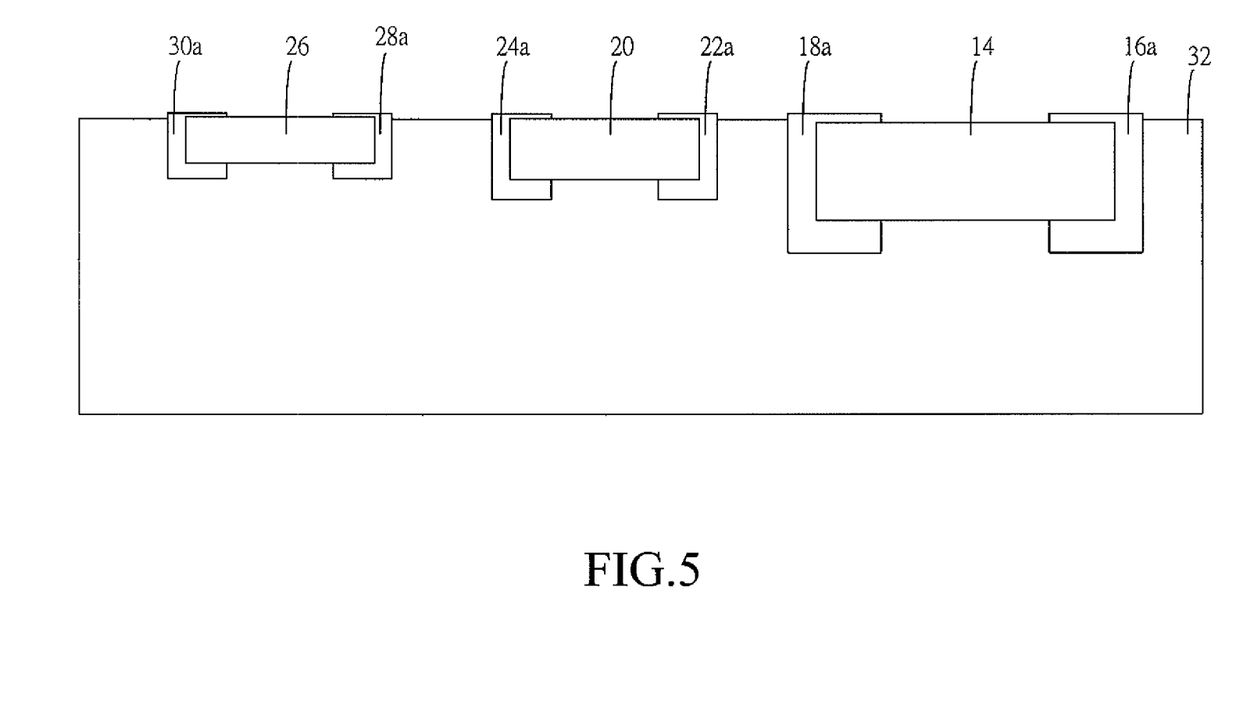

Referring to FIG. 5, a polishing or grinding process is performed until obtaining the processed interconnection pads of each passive component, e.g. interconnection pads 16a, 18a, 22a, 24a, 28a and 30a, utilizing well-known techniques. Noted that all exposed surfaces of the processed interconnection pads 16a, 18a, 22a, 24a, 28a and 30a are coplanar. So far, the passive component module of this embodiment is initially obtained. In another embodiment, one or more of the interconnection pads 16, 18, 22, 24, 28 and 30 might be completely embedded into the molding material 32, so that at least a portion of the molding material 32 needs to be removed until exposing all of the aforementioned interconnection pads.

Figure 6:
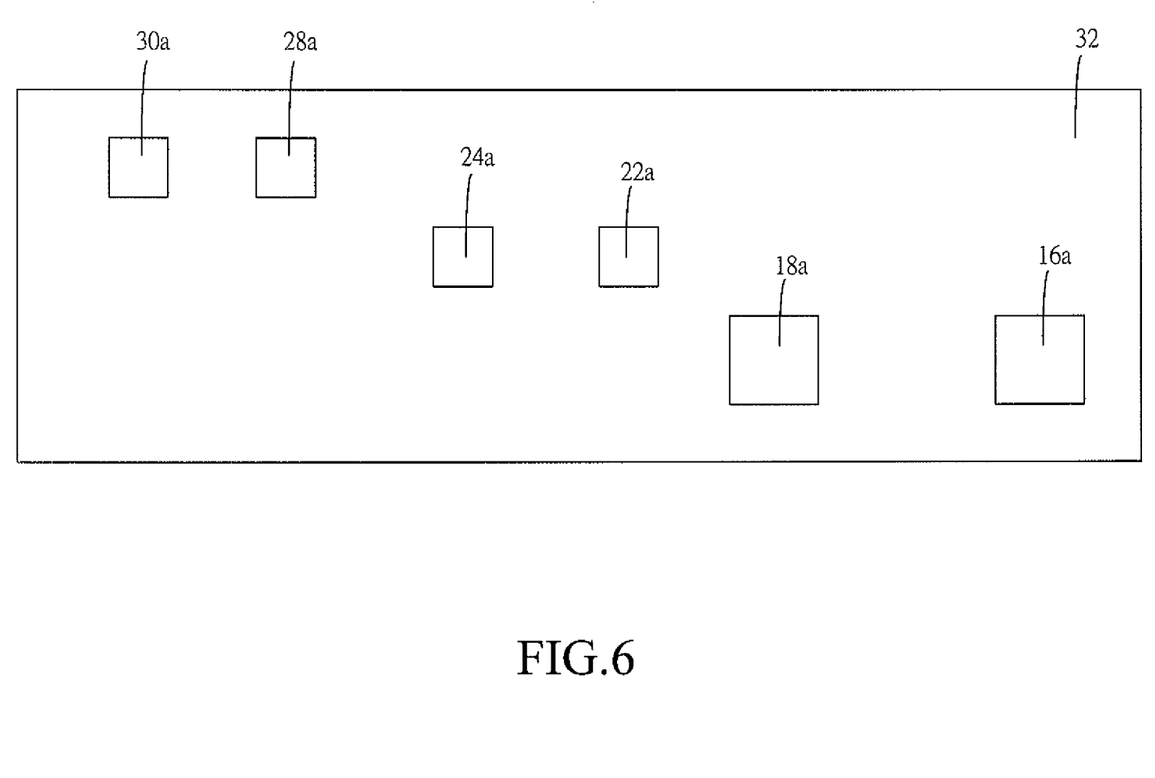
FIG. 6 is a plan view illustrating a passive component module of FIG. 5.
Figure 7A:
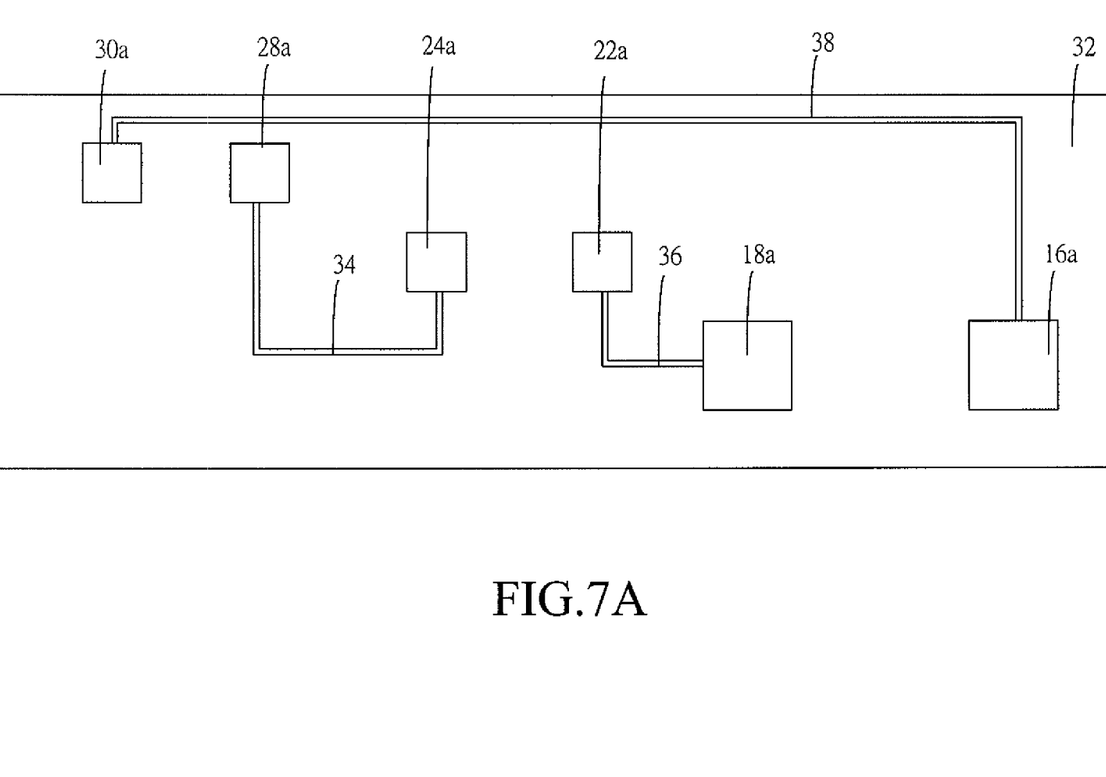
FIG. 7A is a plan view illustrating a passive component module of FIG. 5 that is further processed with an RDL process.
Figure 7B:
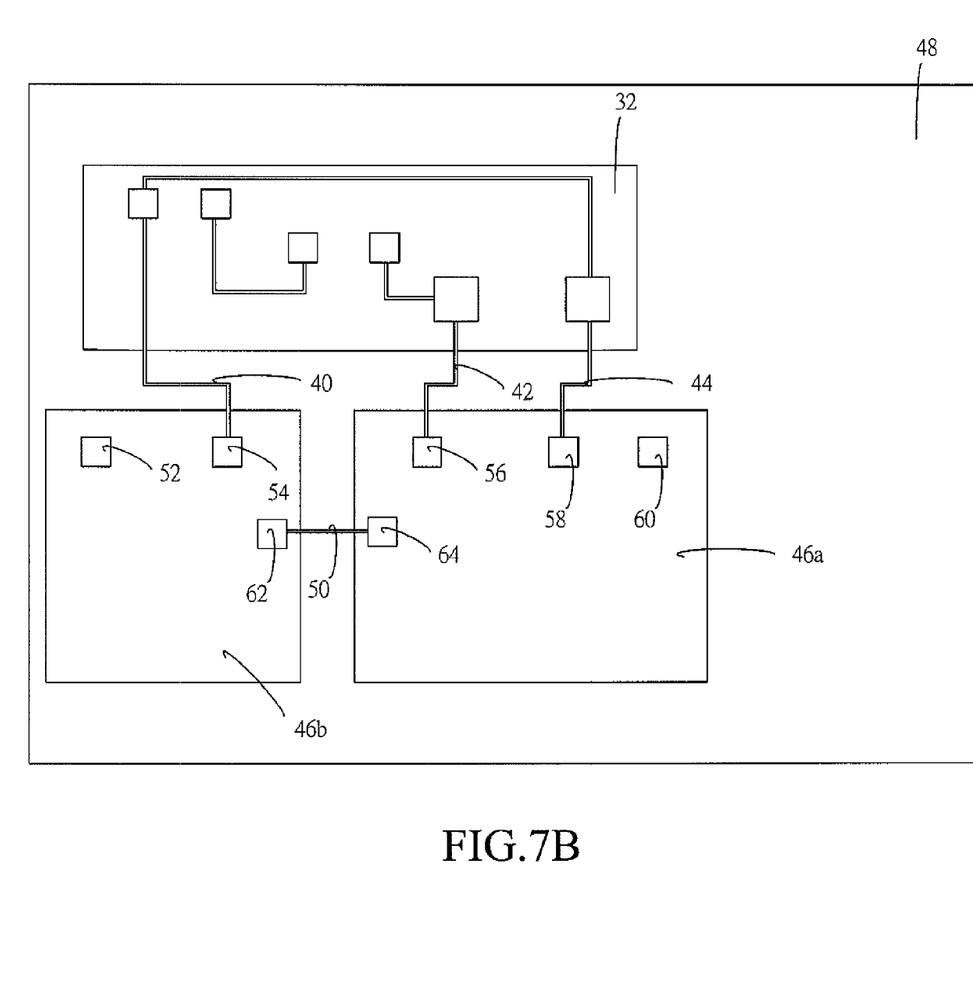
FIG. 7B is a plan view illustrating a portion (or piece) of a print circuit board with the passive component module of FIG. 7A embedded therein.

FIG. 6 is a plan view illustrating a passive component module of FIG. 5. Referring to FIG. 6, all exposed surfaces of the processed interconnection pads 16a, 18a, 22a, 24a, 28a and 30a are going to undergo subsequent processes, e.g. wafer level redistribution (abbreviated as RDL), for creation of electrical connection as shown in FIG. 7. In another embodiment, the passive component module 32 of FIG. 5 can be embedded together with other active or passive components into a PCB substrate prior to being treated with a conventional PCB process for formation of interconnection. The just aforementioned RDL and PCB processes for making electrical connection (or interconnection) will be described later, respectively with reference to FIGS. 7A to 7B and FIGS. 8A to 8B.

FIG. 7A is a plan view illustrating a passive component module of FIG. 5 that is further processed with an RDL process. Referring to FIG. 7A, an RDL process is subsequently performed to further make electrical interconnections 34, 36 and 38 between exposed interconnection pads 16a, 18a, 22a, 24a, 28a and 30a. That is, the electrical interconnection 34 makes electrical contact between the passive components 20 and 26; the electrical interconnection 36 makes electrical contact between the passive components 14 and 20; and the electrical interconnection 38 makes electrical contact between the passive components 14 and 26. So far, the passive components 14, 20 and 26 in this passive component module of this embodiment are electrically coupled to each other.

Figure 9:
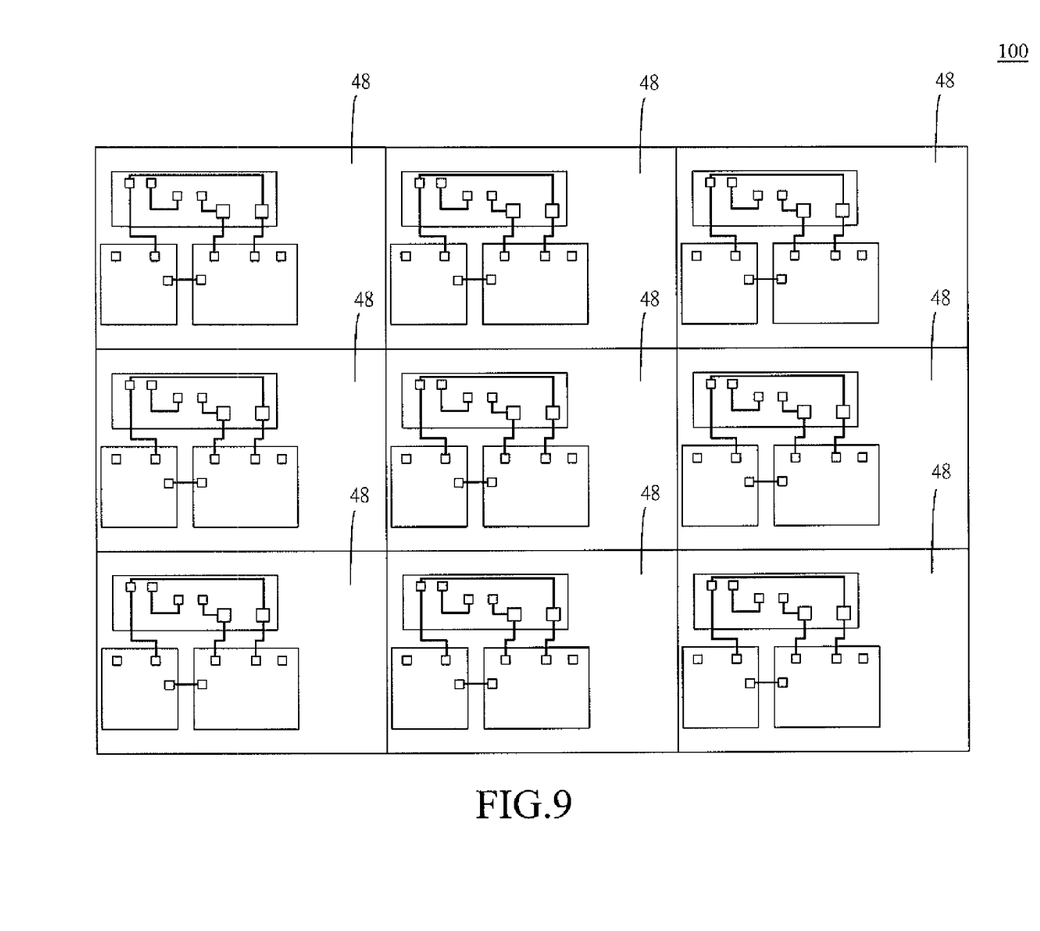
FIG. 9 is a plan view illustrating a print circuit board consisted of a number of pieces as shown in FIG. 7B and FIG. 8B.

FIG. 7B is a plan view illustrating a portion (or piece) 48 of a print circuit board with the passive component module of FIG. 7A embedded therein. Referring to FIG. 7B, the passive component module of FIG. 7A is further embedded into a print circuit board 100 (as shown in FIG. 9) and electrically connected to active and/or passive components 46a and 46b via interconnections 40, 42 and 44 by the known print circuit board manufacturing process. Noted that active and/or passive components 46a and 46b also have interconnection pads 52, 54, 56, 58, 60, 62 and 64 for electronic contact with other interconnection pads. For example, an electrical interconnection 50 makes electrical contact between the interconnection pads 62 and 64; the electrical interconnection 40 makes electrical contact between the interconnection pads 54 and 30a; the electrical interconnection 42 makes electrical contact between the interconnection pads 56 and 18a; and the electrical interconnection 44 makes electrical contact between the interconnection pads 58 and 16a.

Next, another embodiment employing a PCB processes for making electrical connection (or interconnection) will be described below accompanying FIG. 8A and FIG. 8B.

Figure 8A:
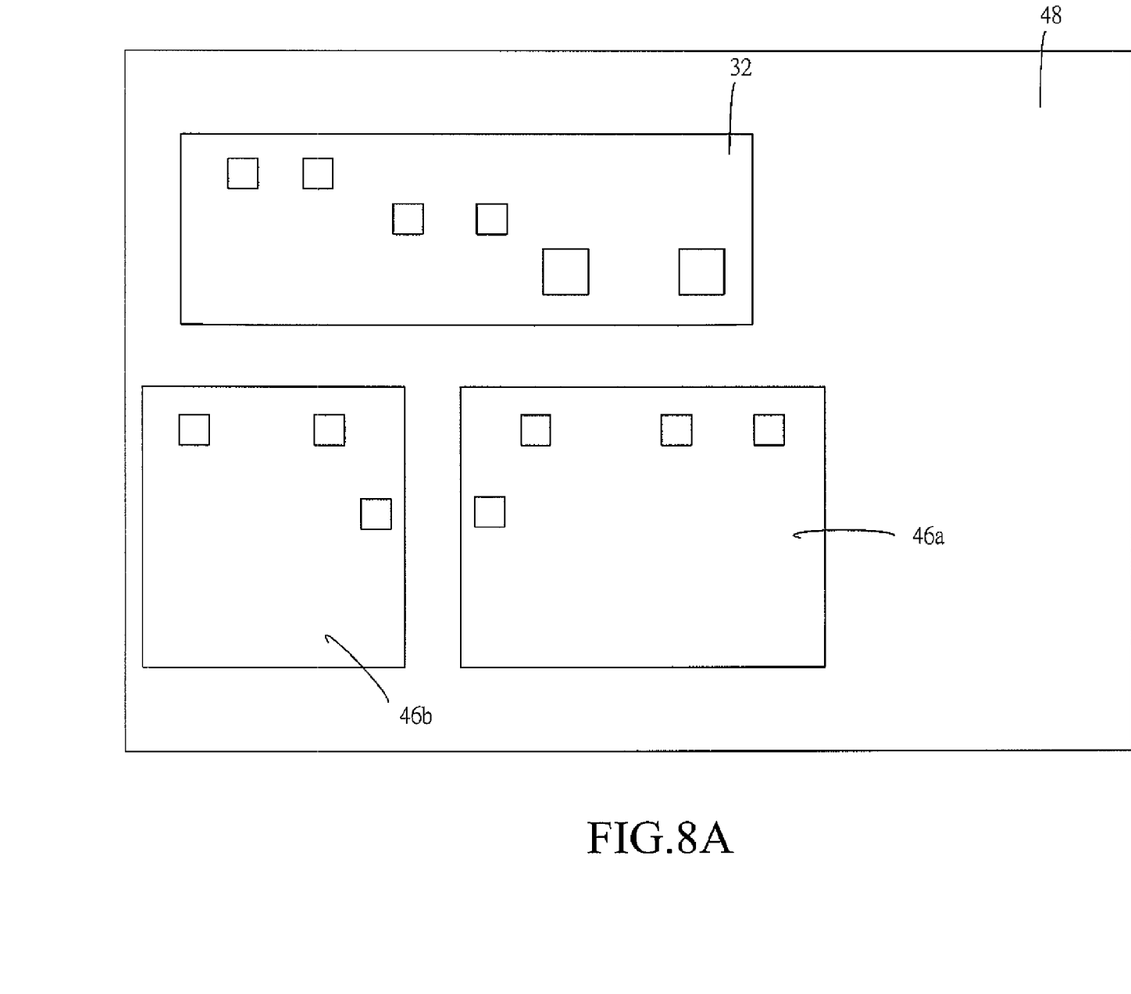
FIG. 8A is a plan view illustrating a portion (or piece) 48 of a print circuit board with a passive component module of FIG. 5.

FIG. 8A is a plan view illustrating a portion (or piece) 48 of a print circuit board with a passive component module of FIG. 5. FIG. 8B is a plan view illustrating a piece of a print circuit board as shown in FIG. 8A that is processed without further RDL process. FIG. 8A shows that all of the passive/active component modules 32, 46a and 46b are embedded into a print circuit board 100 (as shown in FIG. 9). FIG. 8B shows making electrical contact between the interconnection pads of the passive/active component modules 32, 46a and 46b subsequent to the embedding step of FIG. 8A.

Figure 8B:
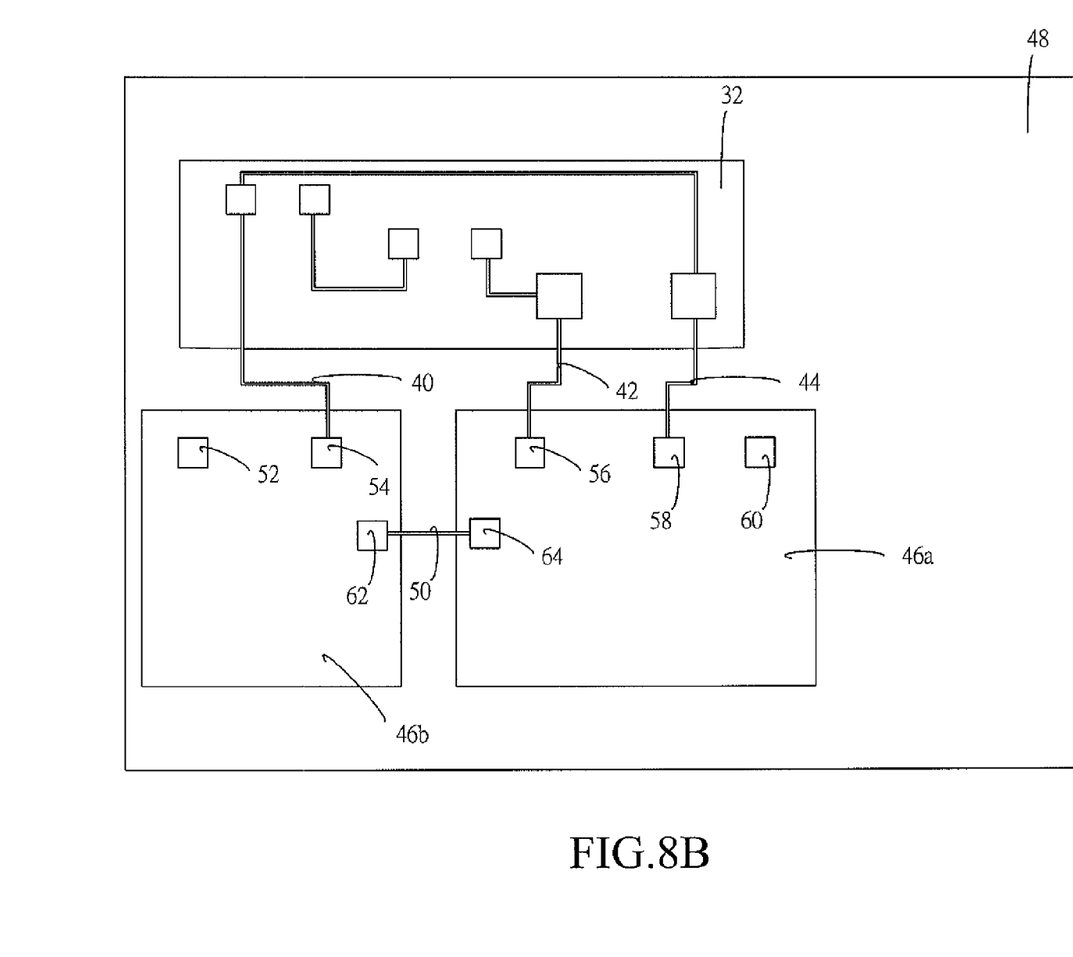
FIG. 8B is a plan view illustrating a piece of a print circuit board as shown in FIG. 8A that is processed without further RDL process.

FIG. 9 is a plan view illustrating a print circuit board consisted of a number of pieces as shown in FIG. 7B and FIG. 8B. As shown in FIG. 9, the print circuit board 100 has a number of portion (or piece) 48 can be protected by suitable materials prior to a cutting process. Such materials can be Pd, Ni, Cu and Au.

Although specific embodiments have been illustrated and described, it will be obvious to those skilled in the art that various modifications may be made without departing from what is intended to be limited solely by the appended claims.

The invention claimed is:

1. A method of manufacturing a passive component module, the method comprising the steps of:
   bonding passive components to a carrier, wherein each of the passive components has interconnection pads;
   forming a dielectric molding material over the carrier, so that the passive components are embedded in the molding material;
   separating the molding material, which has the passive components embedded therein, from the carrier;
   exposing all interconnection pads of the passive components; and
   building electrical interconnections between the passive components to obtain the passive component module,
   wherein the steps of bonding, forming, separating, exposing and building are performed in the recited order.

2. The method of claim 1, wherein the step of bonding is performed using a die bonder or chip shooter.

3. The method of claim 1, further comprising:
   forming an adhesive layer over the carrier prior to the step of bonding.

4. The method of claim 1, wherein the molding material is epoxy resin.

5. The method of claim 1, wherein the carrier comprises glass, fiber resin or ceramic.

6. The method of claim 1, wherein the step of exposing is performed utilizing a polishing or grinding process.

7. The method of claim 1, wherein the step of exposing is performed to remove at least a portion of the molding material.

8. A method of manufacturing a print circuit board, the method comprising:
   embedding (i) at least one active component and (ii) the passive component module formed in accordance with the method of claim 1 into a substrate; and
   building electrical interconnections between the passive component module and the active component to obtain the print circuit board.

9. The method of claim 8, wherein the step of building electrical interconnections between the passive component module and the active component is performed using a wafer level redistribution process.

10. A method of manufacturing a print circuit board, the method comprising the steps of:
    bonding passive components to a carrier, wherein each of the passive components has interconnection pads;
    forming a dielectric molding material over the carrier, the molding material embedding the passive components therein;
    separating the molding material, which has the passive components embedded therein, from the carrier;
    exposing all interconnection pads of the passive components to obtain a passive component module;
    embedding the passive component module and at least one active or passive component into a substrate; and
    building electrical interconnections (i) between the passive components and (ii) between the passive component module and the at least one active or passive component to obtain the print circuit board,
    wherein the steps of bonding, forming, separating, exposing, embedding and building are performed in the recited order.

11. A print circuit board, comprising:
a passive component module manufactured in accordance with the method of claim 1, wherein a plurality of passive components are embedded in the molding material.

12. A print circuit board manufactured in accordance with the method of claim 8, wherein a plurality of passive components are embedded in the molding material.

13. A print circuit board manufactured in accordance with the method of claim 10, wherein a plurality of passive components are embedded in the molding material.

14. A method of manufacturing a passive component module, the method comprising the steps of:
providing a carrier having alignment marks thereon;
bonding passive components to the carrier, wherein bonding locations of the passive components are based upon locations of the alignment marks, and wherein each of the passive components has interconnection pads;
forming a dielectric molding material over the carrier, the molding material embedding the passive components therein;
separating the molding material, which has the passive components embedded therein, from the carrier, wherein the interconnection pads of the passive components protrude from a surface of the molding material, and wherein exposed surfaces of the interconnection pads are located at different heights with respect to the surface of the molding material;
performing a polishing or grinding process to make the exposed surfaces of the interconnection pads coplanar; and
building electrical interconnections on the surface of the molding material and between the coplanar, exposed surfaces of the passive components to obtain the passive component module.

15. The method of claim 14, wherein the steps of bonding, forming, separating, performing the polishing or grinding process, and building are performed in the recited order.

* * * * *